(12) United States Patent
Worledge

(10) Patent No.: US 8,034,637 B2
(45) Date of Patent: *Oct. 11, 2011

(54) TECHNIQUES FOR COUPLING IN SEMICONDUCTOR DEVICES

(75) Inventor: Daniel Christopher Worledge, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 115 days.

This patent is subject to a terminal disclaimer.

(21) Appl. No.: 12/539,058

(22) Filed: Aug. 11, 2009

(65) Prior Publication Data

US 2009/0298202 A1    Dec. 3, 2009

Related U.S. Application Data

(60) Division of application No. 11/338,401, filed on Jan. 24, 2006, now Pat. No. 7,893,470, which is a continuation of application No. 10/699,284, filed on Oct. 31, 2003, now Pat. No. 7,045,838.

(51) Int. Cl.
    *H01L 21/30* (2006.01)
(52) U.S. Cl. ............ 438/3; 438/2; 438/17; 257/295; 257/E21.211; 365/171; 365/173
(58) Field of Classification Search .......... 438/3, 17, 438/2; 257/295, E21.665, E21.211; 365/171, 365/173
    See application file for complete search history.

(56) References Cited

U.S. PATENT DOCUMENTS

| | | | |
|---|---|---|---|
| 5,134,533 A | 7/1992 | Friedrich et al. | |
| 5,587,943 A | 12/1996 | Torok et al. | |
| 5,768,183 A | 6/1998 | Zhu et al. | |
| 6,166,948 A * | 12/2000 | Parkin et al. | 365/173 |
| 6,233,172 B1 | 5/2001 | Chen et al. | |
| 6,478,931 B1 | 11/2002 | Wadley et al. | |
| 6,545,906 B1 | 4/2003 | Savtchenko et al. | |
| 6,567,246 B1 | 5/2003 | Sakakima et al. | |
| 6,633,498 B1 | 10/2003 | Engel et al. | |
| 6,727,105 B1 | 4/2004 | Brug et al. | |
| 6,728,132 B2 | 4/2004 | Deak | |
| 7,045,838 B2 * | 5/2006 | Worledge | 257/295 |

OTHER PUBLICATIONS

Parkin, S.S.P., "Giant Magnetoresistance and Oscillatory Interlayer Coupling in Polycrystalline Transition Metal Multilayers," Ultrathin Magnetic Structures II, pp. 148-194 (May 12, 1995). Parkin, S.S.P., "Giant Magnetoresistance and Oscillatory Interlayer Coupling in Polycrystalline Transition Metal Multilayers," Ultrathin Magnetic Structures II, pp. 148-194 (May 12, 1995).
Pinhole analysis in magnetic Tunnel Junction by Schad et al. Applied Physics Letter Jan. 31, 2000 vol. 76 issue 5 pp. 607-609 ( 2 page ).

* cited by examiner

*Primary Examiner* — Thinh Nguyen
(74) *Attorney, Agent, or Firm* — Ryan, Mason & Lewis, LLP

(57) ABSTRACT

Techniques for exchange coupling of magnetic layers in semiconductor devices are provided. In one aspect, a semiconductor device is provided. The device comprises at least two magnetic layers, and a spacer layer formed between the magnetic layers, the spacer layer being configured to provide ferromagnetic exchange coupling between the layers, the magnetic layers experiencing anti-ferromagnetic dipole coupling, such that a net coupling of the magnetic layers is anti-ferromagnetic in a zero applied magnetic field. The semiconductor device may comprise magnetic random access memory (MRAM). In another aspect, a method for coupling magnetic layers in a semiconductor device comprising at least two magnetic layers and a spacer layer therebetween, the method comprises the following step. Ferromagnetic exchange coupling is provided of the magnetic layers, the magnetic layers experiencing anti-ferromagnetic dipole coupling, such that a net coupling of the magnetic layers is anti-ferromagnetic in a zero applied magnetic field.

19 Claims, 3 Drawing Sheets

TECHNIQUES FOR COUPLING IN SEMICONDUCTOR DEVICES

CROSS REFERENCE TO RELATED APPLICATIONS

This application is a divisional of U.S. patent application Ser. No. 11/338,401, filed on Jan. 24, 2006, which is a continuation of U.S. patent application Ser. No. 10/699,284, filed on Oct. 31, 2003, and now issued as U.S. Pat. No. 7,045,838, each incorporated by reference herein.

FIELD OF THE INVENTION

The present invention relates to semiconductor devices and, more particularly, to coupling of magnetic layers in semiconductor devices.

BACKGROUND OF THE INVENTION

Semiconductor devices, such as magnetic random access memory (MRAM) devices, use magnetic bits to store information. A free layer of the device serves as the magnetic bit. The information is stored as the direction of magnetization of the bit, either pointing right or left, to store "1" or "0." When the bit is sitting in a zero applied magnetic field, its magnetization is stable, pointing either right or left. The application of a magnetic field can be used to write information to the bit by switching the magnetization of the bit from right to left, or vice versa. One of the important requirements for data storage is that the magnetization of the bit not change direction when there is a zero applied field, or only a small applied field.

Unfortunately, in practice, the magnetization of the bits does change directions unintentionally, due to thermal activation. Thermal activation occurs when thermal energy from the environment surrounding the bit overcomes an activation energy barrier to change the direction of magnetization. The occurrences of thermal activation should be minimized. The resulting error rate due to thermally activated switching is called the soft error rate (SER).

One of the objectives in designing MRAM devices is to have low operating power and small area. Low operating power and small area requires a low switching field for the bit. A low switching field uses a low switching current, which in turn uses less power. Further, lower switching currents require smaller switches, which occupy less space.

As the area of the bits becomes increasingly smaller, a process referred to as "scaling" due to the fact that the bit area is scaled down to allow for more bits in the same area, the SER becomes worse. As mentioned above, the activation energy barrier may be overcome due to thermal energy, resulting in thermal activation. Therefore, it is desirable to have a large enough activation energy barrier to prevent thermal activation and the magnetization of the bit changing direction.

According to single domain theory, the activation energy barrier of the bit is proportional to the volume of the bit. Therefore, as the area is scaled down, and if nothing else changes, the activation energy barrier decreases and the SER becomes unacceptably large. A conventional, simple solution to this problem would be to increase the thickness of the bit as the area of the bit is scaled down, to maintain a large enough volume to keep the energy activation barrier large enough. However, this technique quickly runs into problems because a greater magnetic field is required to switch the magnetization of a thicker bit. Thus, a primary goal of the scaling process becomes to make the area of the bit smaller, but to maintain the activation energy barrier and the switching field, i.e., preventing the activation energy barrier from becoming too small and preventing the switching field from becoming too large.

U.S. Pat. No. 6,545,906, issued to Savtchenko et al. (hereinafter "Savtchenko"), discloses a new type of free layer for use in MRAM devices. The free layer is composed of two magnetic layers separated by a non-magnetic spacer layer. In a zero applied magnetic field, the two magnetic layers have moments that are lined up anti-parallel to each other due to anti-ferromagnetic dipole coupling and exchange coupling.

The spacer layer may provide some exchange coupling. This exchange coupling, as described in Savtchenko, is however limited to anti-ferromagnetic exchange coupling.

It would be desirable to be able to produce semiconductor devices that allow for a reduction in area, yet maintain an activation energy barrier and a switching field, such that occurrences of thermal activation are minimized.

SUMMARY OF THE INVENTION

The present invention provides techniques for exchange coupling of magnetic layers in semiconductor devices. In one aspect of the invention, a semiconductor device is provided. The device comprises at least two magnetic layers, and a spacer layer formed between the magnetic layers, the spacer layer being configured to provide ferromagnetic exchange coupling between the layers, the magnetic layers experiencing anti-ferromagnetic dipole coupling, such that a net coupling of the magnetic layers is anti-ferromagnetic in a zero applied magnetic field. The semiconductor device may comprise magnetic random access memory (MRAM).

In another aspect of the invention, a method for coupling magnetic layers in a semiconductor device comprising at least two magnetic layers and a spacer layer therebetween comprises the following step. Ferromagnetic exchange coupling is provided of the magnetic layers, the magnetic layers experiencing anti-ferromagnetic dipole coupling, such that a net coupling of the magnetic layers is anti-ferromagnetic in a zero applied magnetic field.

A more complete understanding of the present invention, as well as further features and advantages of the present invention, will be obtained by reference to the following detailed description and drawings.

DETAILED DESCRIPTION OF PREFERRED EMBODIMENTS

Figure 1:
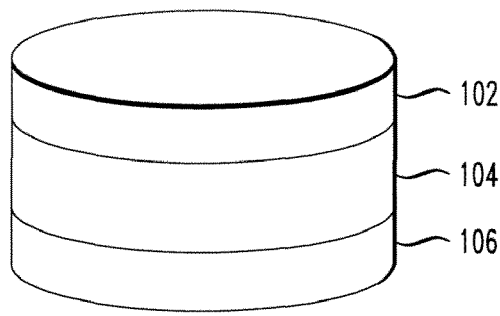
FIG. 1 is a diagram illustrating an exemplary semiconductor device according to an embodiment of the present invention.
Figure 1A:
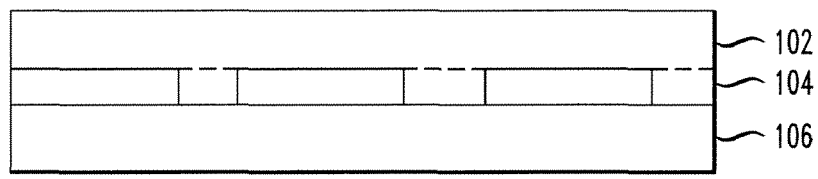

FIG. 1 is a diagram illustrating an exemplary semiconductor device 100. Semiconductor device 100 comprises magnetic layer 102, spacer layer 104 and magnetic layer 106.

Magnetic layers 102 and 106, as shown in FIG. 1, have an elliptical shape. However, in accordance with the teachings presented herein, each of magnetic layers 102 and 106 may have any suitable non-elliptical shape, such as a circular shape.

Each of magnetic layers 102 and 106 may comprise an element including, but not limited to, nickel, cobalt, iron, manganese and combinations comprising at least one of the foregoing elements. In an exemplary embodiment, magnetic layer 102 and/or magnetic layer 106 comprises $Ni_{80}Fe_{20}$. The composition of magnetic layer 102 may be the same as the composition of magnetic layer 106. Alternatively, the composition of magnetic layer 102 may be different from the composition of magnetic layer 106.

The thickness of magnetic layer 102 may be the same as the thickness of magnetic layer 106. Alternatively, the thickness of magnetic layer 102 may be different from the thickness of magnetic layer 106. In an exemplary embodiment, the thickness imbalance between magnetic layer 102 and magnetic layer 106 is less than or equal to about ten percent. For example, the thickness imbalance between magnetic layer 102 and magnetic layer 106 may be less than or equal to about five percent.

Each of magnetic layers 102 and 106 has an intrinsic anisotropy. In an exemplary embodiment, magnetic layers 102 and 106 have the same intrinsic anisotropy.

Spacer layer 104 may comprise a transition metal. Suitable transition metals include, but are not limited to, chromium, copper, ruthenium, rhodium, palladium, rhenium, osmium, iridium, platinum and combinations comprising at least one of the foregoing transition metals. In an exemplary embodiment, spacer layer 104 comprises ruthenium. In a further exemplary embodiment, spacer layer 104 is non-magnetic.

Spacer layer 104 may comprise an insulating layer. Suitable insulating layers include, but are not limited to, layers comprising aluminum oxide.

In an exemplary embodiment, spacer layer 104 has a thickness of greater than or equal to about 0.5 nanometers (nm). For example, spacer layer 104 may have a thickness of from about one nm to about 1.6 nm. In another exemplary embodiment, spacer layer 104 has a thickness of greater than or equal to about two nm. For example, spacer layer 104 may have a thickness of from about two nm to about 2.8 nm.

Spacer layer 104 may comprise an incomplete layer. For example, spacer layer 104 may comprise pinholes.

In another embodiment, spacer layer 104 may comprise a weak ferromagnetic layer. Such a layer comprises an alloy with a composition comprising at least one of magnesium, iron, cobalt and nickel.

Spacer layer 104 provides exchange coupling of magnetic layers 102 and 106. The exchange coupling of magnetic layers 102 and 106 by spacer layer 104 may be either ferromagnetic or anti-ferromagnetic, due in part to the characteristics of spacer layer 104, including, but not limited to, the composition of spacer layer 104 and/or the thickness of spacer layer 104. In an exemplary embodiment, the exchange coupling of magnetic layers 102 and 106 by spacer layer 104 is ferromagnetic. Having ferromagnetic exchange coupling as disclosed herein is unique, given the fact that, as will be described in detail below, a net coupling of magnetic layers 102 and 106 is anti-ferromagnetic. Further, since the thickness of spacer layer 104 impacts the exchange coupling of magnetic layer 102 and 106, in another exemplary embodiment, the thickness of spacer layer 104 is varied to attain ferromagnetic exchange coupling of magnetic layers 102 and 106.

Magnetic layers 102 and 106, in a zero applied magnetic field, will have magnetic moments that line up anti-parallel to each other due to anti-ferromagnetic dipole coupling. Anti-ferromagnetic dipole coupling occurs as a result of the termination of the magnetic materials at the ends of the bit and the magnetic poles that are formed there. According to the teachings herein, the net coupling, i.e., the sum of the exchange coupling and the dipole coupling, of magnetic layers 102 and 106 is anti-ferromagnetic when semiconductor device 100 is in the presence of a zero applied magnetic field. Techniques for attaining ferromagnetic exchange coupling when the net coupling of magnetic layers 102 and 106 is anti-ferromagnetic, in the presence of a zero applied magnetic field, will be described in detail below.

The techniques, as provided herein, derive the exact single domain theory that describes the phenomena wherein the exchange coupling of magnetic layers 102 and 106 is ferromagnetic, but the net coupling is anti-ferromagnetic. This new theoretical understanding makes it clear that ferromagnetic exchange coupling is beneficial. For ease of reference, the following description will be divided into the following sections: (I) Single Domain Model and (II) Identifying Ferromagnetic Coupling.

I. Single Domain Model

For simplicity, it is assumed that magnetic layers 102 and 106 have the same thickness t. The results, however, are not substantially affected by small thickness imbalances. Thickness imbalance tolerances are described in detail above. The single domain calculation also assumes that magnetic layers 102 and 106 are in the shape of an ellipse, have the same intrinsic anisotropy $H_i$ (in the direction of the long axis of the ellipse), have magnetization $M_s$, have width b, have length a and are coupled together by an exchange coupling J. However, as was highlighted above for example, magnetic layers 102 and 106 may have any suitable shape. An exchange coupling wherein J is greater than zero comprises ferromagnetic coupling and an exchange coupling wherein J is less than zero comprises antiferromagnetic coupling.

Figure 2:
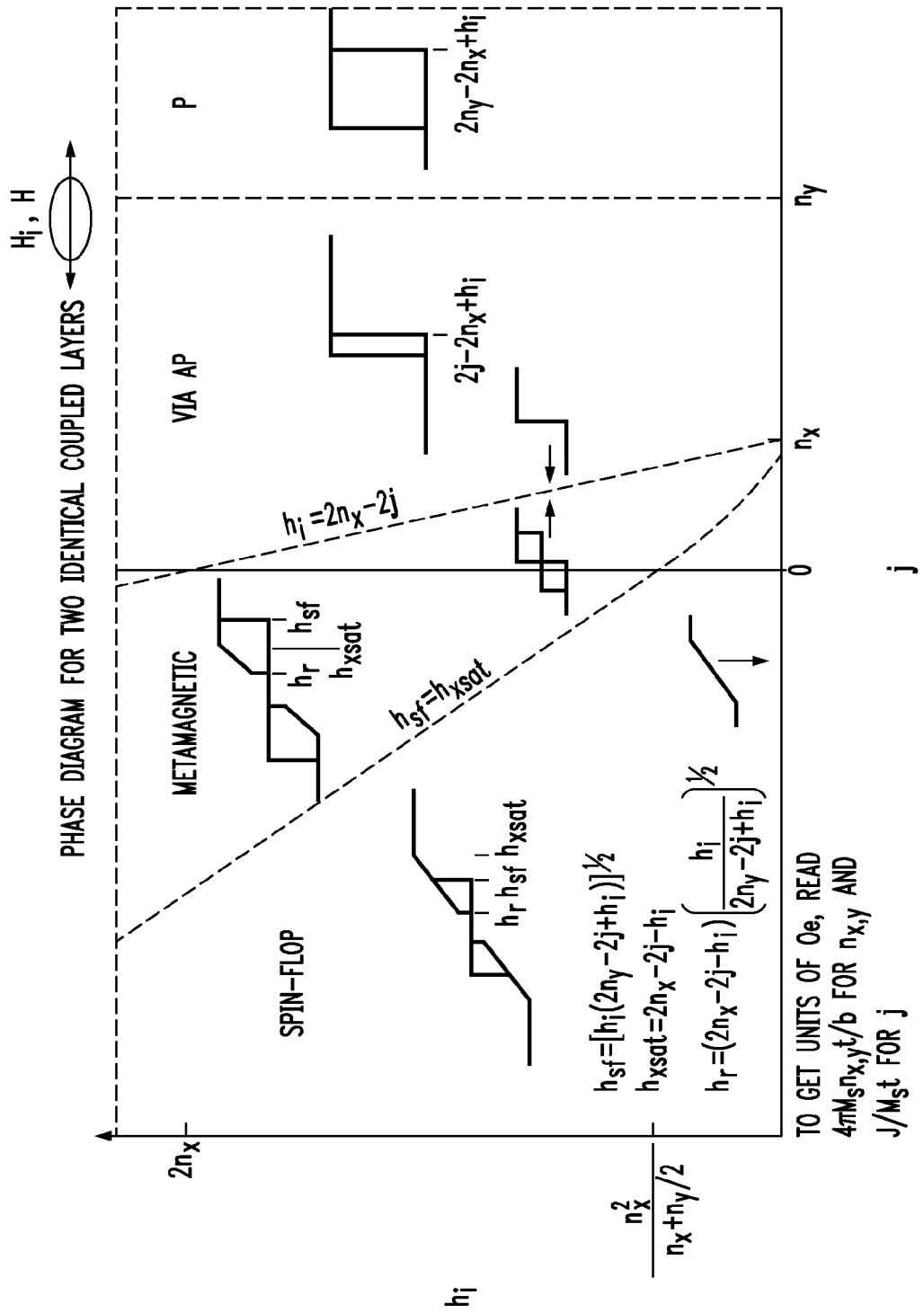
FIG. 2 is a phase diagram for two identical coupled layers according to an embodiment of the present invention.

FIG. 2 is a phase diagram for two identical coupled layers. Namely, the phase diagram in FIG. 2 classifies all of the possible behaviors that can be found when a magnetic field is swept along the easy axis of semiconductor device 100, as referred to above in conjunction with the description of FIG. 1. The phases are organized according to the type of hysteresis loop that the single domain model predicts. The phase on the left of the diagram, labeled "spin-flop," is the relevant phase for magnetic random access memory (MRAM). The phase diagram in FIG. 2 makes it clear that, even though most of the phase exists where J is negative (antiferromagnetic coupling), this spin-flop phase extends into the region where J is positive (ferromagnetic coupling).

Figure 3:
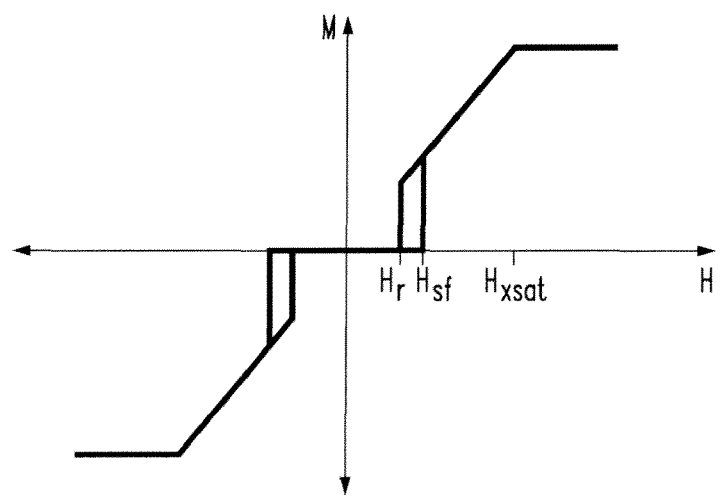
FIG. 3 is a hysteresis loop for a sample in the spin-flop phase, as predicted by the single domain model according to an embodiment of the present invention.

FIG. 3 is a hysteresis loop for a sample in the spin-flop phase, as predicted by the single domain model. The spin-flop field $H_{sf}$ is the field at which the MRAM is written, and the saturation field $H_{xsat}$ is the field wherein the magnetic moments of magnetic layers 102 and 106 line up parallel to each other.

$H_{xsat}$ determines the write margins of semiconductor device 100, as referred to above in conjunction with the description of FIG. 1. In a toggle mode, staying below $H_{xsat}$ during full select is needed. In direct mode, staying below the related saturation field (along the half select direction) during half select is needed. Toggle and direct write modes are described in detail in Savtchenko, the disclosure of which is incorporated by reference herein. Therefore, it is beneficial to be able to control parameters, such as the two fields $H_{sf}$ and $H_{xsat}$.

A third parameter that needs to be controlled is that of the activation energy in zero field $E_a$. Solving the single domain model for the three parameters, $H_{sf}$, $H_{xsat}$ and $E_a$ gives the following values, $$H_{xsat} = 8\pi M_s n_x \frac{t}{b} - \frac{2J}{M_s t} - H_i \quad (1)$$

$$H_{sf} = \left[ H_i \left( 8\pi M_s n_y \frac{t}{b} - \frac{2J}{M_s t} + H_i \right) \right]^{1/2} \quad (2)$$

$$E_a = \frac{\pi M_s abt H_i}{4}, \quad (3)$$

wherein $n_x$ and $n_y$ are the reduced demagnetizing factors for magnetic layers 102 and 106 having an elliptical shape (for a circle, $n_x$ equals $n_y$ which equals 0.79, and for an aspect ratio equal to two, $n_x$ equals 0.32 and $n_y$ equals 0.90). Equations 1 through 3 illustrate that making J positive (ferromagnetic coupling) will reduce the switching fields.

A more detailed analysis shows that for magnetic layers 102 and 106 having a circular shape, the parameters t, $H_i$ and J can always be chosen to satisfy any choice of $H_{sf}$, $H_{xsat}$ and $E_a$, $$H_i = \frac{H_{xsat}}{4} \left[ \left( 1 + 8 \frac{H_{sf}^2}{H_{xsat}^2} \right)^{1/2} - 1 \right] \quad (4)$$

$$J = \frac{64(0.78)E_a^2}{\pi b^5 H_f^2} - \frac{2E_a}{\pi b^2}\left(1 + \frac{H_{xsat}}{H_i}\right) \quad (5)$$

$$t = \frac{4E_a}{\pi b^2 M_s H_i}. \quad (6)$$

Equations 4 through 6 further show how to choose the parameters t, $H_i$ and J in order to satisfy any desired activation energy, write field (determined by $H_{sf}$) and write margin (determined by $H_{xsat}$).

Figure 4:
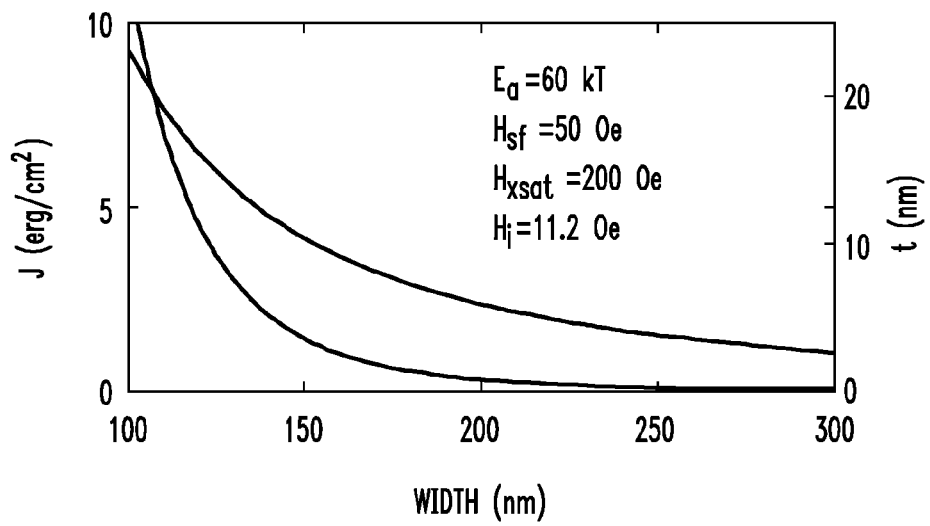
FIG. 4 is a graph illustrating the choosing of parameters for an exemplary circular semiconductor device to attain desired characteristics according to an embodiment of the present invention.

FIG. 4 is a graph illustrating the choosing of parameters for an exemplary circular semiconductor device to attain desired characteristics. Namely, the parameters t, $H_i$ and J are chosen to satisfy a desired activation energy, write field and write margin. In this exemplary embodiment, a free layer is designed with an $E_a$ equal to 60 kT (wherein k is Boltzmann's constant and T is absolute temperature), $H_{sf}$ equal to 50 oersted (Oe) and $H_{xsat}$ equal to 200 Oe.

Equation 4 sets $H_i$ equal to 11.2 Oe. The parameters t and J are then simply chosen from Equations 5 and 6 depending on the junction width. For example, a junction width of 200 nm requires a t equal to 5.8 nm, and a J equal to 0.29 ergs per square centimeter (erg/cm²). Note that the required J is positive, indicating ferromagnetic coupling. By using Equations 4 through 6 as the junction width b is reduced, $E_a$ can be held fixed at a large enough value to essentially eliminate the soft error rate (SER), while simultaneously also holding $H_{sf}$ and $H_{xsat}$ fixed.

II. Identifying Ferromagnetic Coupling

Figure 5:
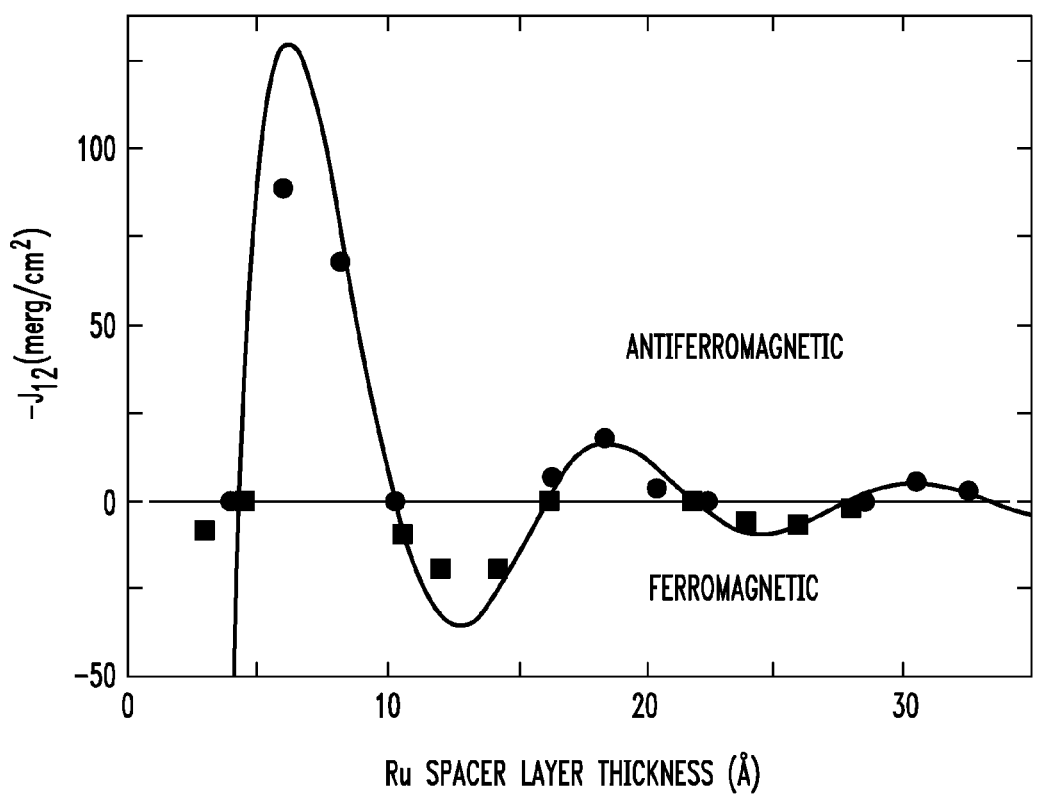
FIG. 5 is a graph illustrating standard measurements of exchange coupling as a function of spacer layer thickness.

Identifying when a structure utilizes ferromagnetic exchange coupling is straightforward. J depends on the composition of the spacer layer, the composition of the magnetic layers and the spacer layer thickness. Standard measurements, such as those shown in FIG. 5, are reported in the literature. See, for example, S. S. P. Parkin, *Giant Magnetoresistance and Oscillatory Interlayer Coupling in Polycrystalline Transition Metal Multilayers*, in ULTRATHIN MAGNETIC STRUCTURES II (B. Heinrich et al., eds., 1994), the disclosure of which is incorporated by reference herein. Namely, FIG. 5 is a graph illustrating standard measurements of exchange coupling as a function of spacer layer thickness. In FIG. 5, J is measured for two magnetic layers comprising $Ni_{80}Co_{20}$, sandwiched around an exchange spacer layer comprising ruthenium, for various different spacer layer thicknesses.

The data show that, for these materials, the coupling is ferromagnetic for a spacer layer having a thickness of between about one nm to about 1.6 nm, and also between about 2.2 nm to about 2.8 nm. Therefore, one way to determine if a given structure exhibits ferromagnetic exchange coupling would be to measure the composition of the spacer layer, the compositions of the magnetic layers and the thickness of the spacer layer, and then reference the corresponding data in the literature, i.e., in FIG. 5.

Another way to determine if a given structure exhibits ferromagnetic exchange coupling is to measure the fields $H_{sf}$ and $H_{xsat}$. Then, make a comparison structure that uses a different spacer layer material which is know to give zero exchange coupling. Spacer layer materials that give zero exchange coupling are known, and include, aluminum, titanium, zirconium, hafnium and combinations comprising at least one of the foregoing materials. The comparison structure may also employ a thick spacer material, i.e., one that always gives zero exchange coupling (having a thickness of greater than or equal to about seven nm). The fields $H_{sf}$ and $H_{xsat}$ of this comparison structure may then be measured. If the fields $H_{sf}$ and $H_{xsat}$ in the comparison structure are larger than the given structure, then from Equations 1 through 3 the original structure must utilize a positive J (ferromagnetic exchange coupling).

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A method for coupling magnetic layers in a semiconductor device comprising at least two magnetic layers and a spacer layer therebetween, the method comprising the step of providing ferromagnetic exchange coupling of the magnetic layers, the magnetic layers experiencing anti-ferromagnetic dipole coupling, such that a net coupling of the magnetic layers is anti-ferromagnetic in a zero applied magnetic field.

2. The method of claim 1, wherein the spacer layer comprises a transition metal.

3. The method of claim 2, wherein the transition metal is selected from the group consisting of chromium, copper, ruthenium, rhodium, palladium, rhenium, osmium, iridium, platinum and combinations comprising at least one of the foregoing transition metals.

4. The method of claim 1, further comprising the step of varying a thickness of the spacer layer to attain ferromagnetic exchange coupling of the magnetic layers.

5. The method of claim 1, wherein the net coupling of the magnetic layers comprises a sum of the exchange coupling and the dipole coupling.

6. The method of claim 1, wherein each of the magnetic layers has a same thickness.

7. The method of claim 1, wherein a difference in a thickness of each of the magnetic layers relative to one another is less than or equal to about ten percent.

8. The method of claim 1, wherein the magnetic layers are elliptical.

9. The method of claim 1, wherein the magnetic layers are circular.

10. The method of claim 1, wherein each of the magnetic layers has a same intrinsic anisotropy.

11. The method of claim 1, wherein one or more of the magnetic layers comprises an element selected from the group consisting of nickel, cobalt, iron, manganese and combinations comprising at least one of the foregoing elements.

12. The method of claim 1, wherein one or more of the magnetic layers comprise $Ni_{80}Fe_{20}$.

13. The method of claim 1, wherein the spacer layer comprises an incomplete layer.

14. The method of claim 1, wherein the spacer layer comprises pinholes.

15. The method of claim 1, wherein the spacer layer comprises an insulator.

16. The method of claim 1, wherein the spacer layer comprises aluminum oxide.

17. The method of claim 1, wherein the spacer layer is non-magnetic.

18. The method of claim 1, wherein the spacer layer has a thickness of from about one nanometer to about 1.6 nanometers.

19. The method of claim 1, wherein the spacer layer has a thickness of from about two nanometers to about 2.8 nanometers.

* * * * *